United States Patent
Horiuchi et al.

(10) Patent No.: US 6,271,483 B1
(45) Date of Patent: Aug. 7, 2001

(54) WIRING BOARD HAVING VIAS

(75) Inventors: Michio Horiuchi; Toshiaki Suyama; Masakuni Tokita, all of Nagano (JP)

(73) Assignee: Shinko Electric Industries Co., LTD, Nagano (JP)

(*) Notice: Subject to any disclaimer, the term of this patent is extended or adjusted under 35 U.S.C. 154(b) by 0 days.

(21) Appl. No.: 09/202,432

(22) PCT Filed: Apr. 16, 1998

(86) PCT No.: PCT/JP98/01746

§ 371 Date: Dec. 15, 1998

§ 102(e) Date: Dec. 15, 1998

(87) PCT Pub. No.: WO98/47326

PCT Pub. Date: Oct. 22, 1998

(30) Foreign Application Priority Data

Apr. 16, 1997 (JP) .................................................... 9-98681

(51) Int. Cl.[7] .................................. H06R 9/09; H05K 1/09
(52) U.S. Cl. .......................... 174/265; 174/251; 174/261; 174/262; 439/91; 439/66; 361/803
(58) Field of Search ................................ 174/262, 52, 88, 174/251, 265; 361/784, 792, 793, 794, 795, 803, 804; 439/91, 66, 67

(56) References Cited

U.S. PATENT DOCUMENTS

| | | | |
|---|---|---|---|
| 5,055,966 | * 10/1991 | Smith et al. | 174/52 |
| 5,197,892 | * 3/1993 | Yoshizawa et al. | 174/52 |
| 5,286,926 | * 2/1994 | Kimura et al. | 174/260 |
| 5,315,072 | * 5/1994 | Arai et al. | 174/250 |
| 5,340,947 | * 8/1994 | Credle et al. | 174/263 |
| 5,699,613 | * 12/1997 | Chong et al. | 174/264 |
| 5,920,123 | * 7/1999 | Moden | 174/260 |
| 5,949,030 | * 9/1997 | Fasano et al. | 174/264 |
| 6,004,657 | * 12/1999 | Moriyasu et al. | 174/255 |

FOREIGN PATENT DOCUMENTS 56-146264 11/1981 (JP) .
63-193587 8/1988 (JP) .

* cited by examiner

*Primary Examiner*—Jeffrey Gaffin
*Assistant Examiner*—Ishwar B Patel
(74) *Attorney, Agent, or Firm*—Staas & Halsey LLP

(57) ABSTRACT

A wiring board has vias which penetrate the wiring board from one side to the other side. The vias are radially arranged in the direction from one side to the other side so that the interval between the vias on one side can be made smaller than the interval between the vias on the other side. In order to prevent the vias from being electrically short-circuited to each other, even if the interval between the vias provided on one side of the wiring board is extremely reduced, a plurality of vias are radially arranged in the direction from one side of the wiring board to the other side so that an interval between the vias on one side of the wiring board can be made smaller than interval of the vias on the other side. A conductor forming the core portion of the via is coated with a sheath portion made of insulating material.

5 Claims, 5 Drawing Sheets

WIRING BOARD HAVING VIAS

SPECIFICATION

1. Technical Field

The present invention relates to a wiring board. More particularly, the present invention relates to a wiring board having a plurality of vias penetrating the wiring board from one side to the other side, which are radially extending from one side to the other side of the wiring board so that the interval between the vias on one side can be smaller than that between the vias on the other side.

2. Background Art

On the conventional wiring board, arranging of wires is conducted on a flat portion of its surface. Therefore, when the number of terminals of semiconductor elements to be mounted on the wiring board is increased, it is common to use a high density wiring board or a multiple layer wiring board on which a plane wiring layer is formed in multiple layers, so that the wiring density can be enhanced.

However, recently, semiconductor elements have become highly integrated. As a result, from the viewpoints of technique and manufacturing cost, it is difficult to provide a high density wiring board or a multiple layer wiring board to meet the demand for high integration.

The prior art to meet the demand for high integration is disclosed in Japanese Unexamined Patent Publication No. 56-146264. In the above patent publication, a wiring 30 board such as that shown in FIGS. 9(*a*) to 9(*c*) is disclosed.

As shown in FIG. 9(*b*), this wiring board is composed as follows. Vias 102, 102, • •, which penetrate a wiring board 100 made of resin from one side 100*a* to the other side 100*b*, are radially extending along the direction from one side 100*a* to the other side 100*b*. As can be seen in FIG. 9(*a*) showing a state on one side 100*a* of the wiring board 100 and can also be seen in FIG. 9(*c*) showing a state on the other side 100*b*, interval Wa between the vias on one side 100*a* of the wiring board 100 is smaller than interval Wc between the vias on the other side 100*b*.

According to the wiring board 100 shown in FIGS. 9(*a*) to 9(*c*), even when the vias 102, 102, • • are arranged on one side 100*a* of the wiring board 100 at high density so that flip chip type semiconductor elements (not shown), on the bottom surfaces of which a large number of bumps to be used as electrode terminals are provided, can be mounted on one side 100*a*, the vias 102, 102, • • can be arranged on the other side 100*b* of the wiring board 100 at low density so that external connecting terminals can be mounted. Due to the above arrangement, it is possible to provide a wiring board on which flip chip type semiconductor elements, which have been highly accumulated, can be mounted.

However, in the case of the wiring board 100 shown in FIGS. 9(*a*) to 9(*c*), since a plurality of vias 102 are electrically insulated from each other by the layers of insulating resin forming the wiring board 100, there is a possibility that the vias 102 are in contact with and short-circuited to each other because the thicknesses of the resin layers to insulate the vias 102 from each other are extremely reduced on the side 100*a* of the wiring board 100 on which the vias 102, 102, • • are arranged at high density.

SUMMARY OF THE INVENTION

On the other hand, recently, there is a tendency to increased the rate of integration of the semiconductor elements. Accordingly, it is necessary to further reduce the interval Wa between the vias on the side 100*a* of the wiring board 100.

Therefore, it is an object of the present invention to provide a wiring board characterized in that: vias penetrating the wiring board from one side to the other side are radially arranged in the direction from one side to the other side so that the interval of the vias on one side of the wiring board can be made smaller than the interval of the vias on the other side; and there is no possibility that the vias are electrically short-circuited even when the interval between the vias formed on one side of the wiring board is extremely reduced.

The inventors of the present application made investigation to solve the above problems. As a result of the investigation, the following knowledge has been found. When an electric conductor forming the via is covered with an organic insulator, even if the interval between the vias provided on one side of the wiring board is extremely reduced, there is no possibility that the electric conductors are contacted and short-circuited to each other. In this way, the inventors have accomplished the invention.

The present invention provides a wiring board characterized in that: a plurality of vias penetrating from one side to the other side of the wiring board are radially formed in the direction from one side to the other side of the wiring board so that an interval between the vias on one side of the wiring board can be made smaller than an interval between the vias on the other side; and the vias are coated with sheath portions made of the same electric conductor as that forming the cores of the vias.

In the present invention described above, on one side of the wiring board, the interval between the vias of which is smaller than that on the other side, when the vias are formed so that at least some of the sheath portions of the vias are in contact with the sheath portions of the adjacent vias, it is possible to form the vias on one side of the wiring board at high density.

The present invention provides a wiring board characterized in that: a plurality of vias penetrating from one side to the other side of the wiring board are radially formed in the direction from one side to the other side of the wiring board so that the interval between the vias on one side of the wiring board can be made smaller than the interval between the vias on the other side; an electric conductor forming a core of the via is coated with a first sheath portion made of an insulator; and the first sheath portion is coated with a second sheath portion which is a conductor layer.

In the present invention described above, on one side of the wiring board, the interval between the vias of which is smaller than that on the other side, when the vias are formed so that at least some of the second sheath portions of the vias can be contacted with the second sheath portions of the adjacent vias, it is possible to form the vias on one side of the wiring board at high density.

When the second sheath portion made of a conductor is electrically connected to a ground line formed on the wiring board, it is possible to form a coaxial-cable-like via in which the core made of a conductor is surrounded and shielded by the second sheath portion. The thus formed wiring board can be applied to a device in which high frequency is used.

In the case of the wiring board of the present invention, when the outer circumferential surface of the metallic wire of the via is coated with an insulator and the outer circumferential surface of the insulator is coated with a conductor layer, it is possible to form a via of the two layer structure.

According to the present invention, the conductor forming the core of the via is coated with the sheath portion made of an insulator. Therefore, even when the sheath portion of the via is contacted with the sheath portion of the adjacent via, there is no possibility that the cores are contacted and short-circuited with each other.

Due to the foregoing, in the case of the wiring board on which the vias penetrating the wiring board from one side to the other side are radially arranged in the direction from one side to the other side so that the interval between the vias on one side can be made smaller than the interval between the vias on the other side, even if the interval between the vias on one side of the wiring board is extremely reduced and the sheath portion of the via is contacted with that of the adjacent via, there is no possibility that the cores are contacted and short-circuited to each other.

Therefore, the interval between vias on one side of the wiring board can be further reduced. Accordingly, the density of the wiring board can be further increased in accordance with the demand for high integration of semiconductors.

MOST PREFERRED EMBODIMENT FOR CARRYING THE INVENTION

Figure 1A:
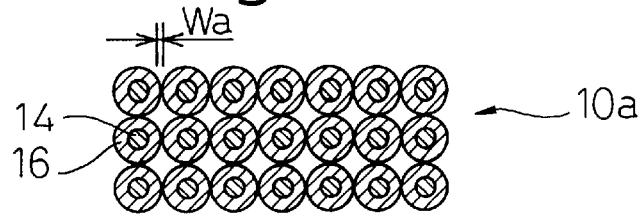
FIGS. 1(a) to 1(c) are cross-sectional views showing a wiring board having vias of the present invention.
Figure 1B:
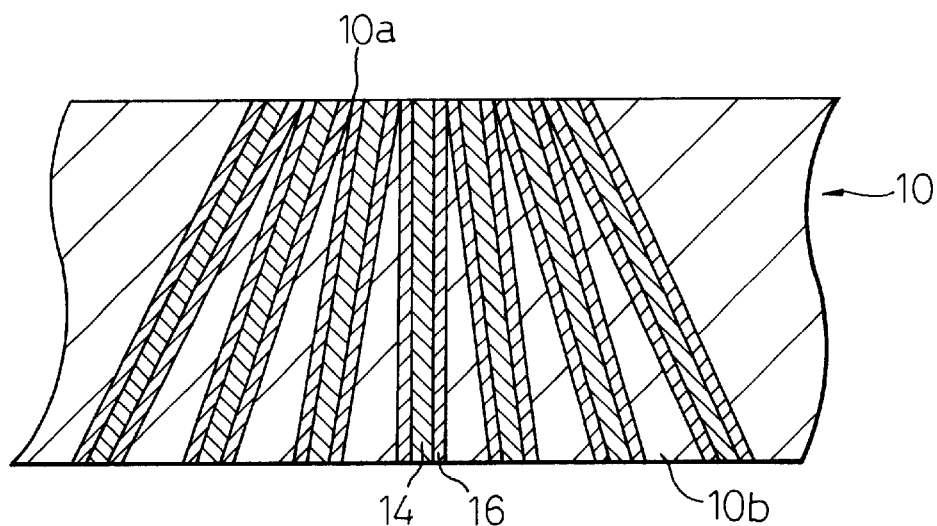
Figure 1C:
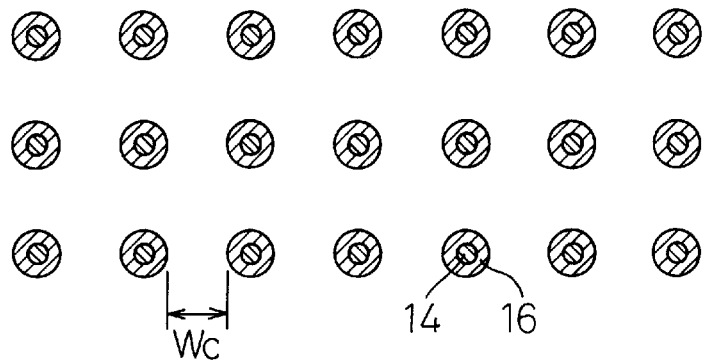
Figure 2A:
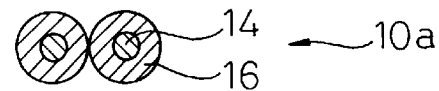
FIGS. 2(a) to 2(c) are schematic illustrations for explaining an example of the wiring board of the present invention.
Figure 2B:
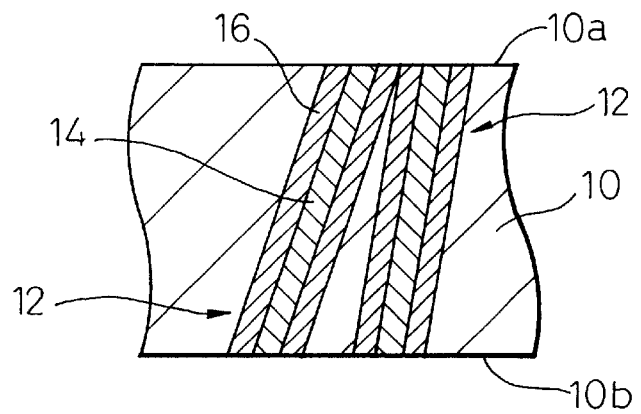
Figure 2C:
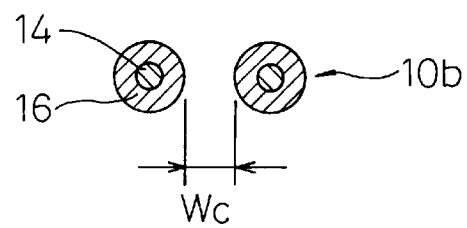

FIGS. 1(a) to 1(c) are cross-sectional views showing a wiring board having vias according to an embodiment of the present invention. FIGS. 2(a) to 2(c) are schematic illustrations showing a portion of the wiring board. As shown in these drawings, the wiring board of the present invention is composed in such a manner that vias 12, 12, • • penetrating the wiring board 10 made of resin from one side 10a (the upper side in the drawing) to the other side 10b (the lower side in the drawing) radially extend along the direction from one side 10a to the other side 10b. As can be seen in FIG. 1(a) showing a state of one side 10a of the wiring board 10 and can also be seen in FIG. 1(c) showing a state of the other side 10b of the wiring board 10, the interval Wa between the vias on one side 10a of the wiring board 10 is smaller than the interval Wb between the vias on the other side 10b. In the embodiment shown in the drawing, interval Wa is substantially zero.

This via 12 includes a core and sheath structure (two layer structure) in which the core portion 14 made of an electric conductor such as copper or aluminum is coated with a sheath portion 16 made of an insulator. Since the interval Wa is zero on one side 10a, the via 12 substantially comes into contact with the adjacent via 12 through the sheath portion 16 on one side 10a of the wiring board 10.

Figure 3:
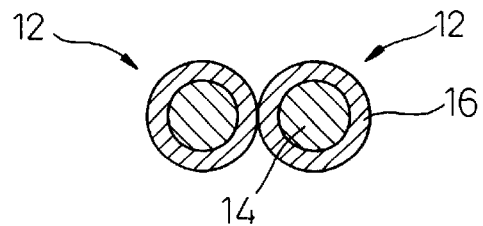
FIG. 3 is a schematic illustration for explaining a state in which vias come into contact with each other on one side of the wiring board shown in FIGS. 2(a) to 2(c).

On the wiring board 10 on which the vias 12, 12, • • having the core and sheath structure described above are arranged, the interval Wa between the vias is extremely small on one side 10a, and even when the sheath portions 16 of the vias 12, 12 are in contact with each other as shown in FIG. 3, or even when the sheath portions 16 of the vias 12, 12 are pushed to each other, it is possible to prevent the core portions 14 from being short-circuited to each other because the core portions 14 made of a conductor are electrically insulated from each other by the sheath portions 16. Due to the foregoing, it is possible to form the vias 12, 12, • • at high density on one side 10a of the wiring board 10, and highly accumulated semiconductor elements of a flip chip type, on the bottom surface of which a large number of bumps are formed so as to be used as electrode terminals, can be mounted on one side 10a of the wiring board 10.

On the other side 10b of the wiring board 10, it is possible to increase the interval Wc between the vias 12, 12, • • so that external connecting terminals (not shown) such as solder balls can be arranged. Therefore, the external connecting terminals can be easily attached to the other side 10b of the wiring board 10.

In this case, the vias 12 constituting the wiring board may be made of wires of metal such as copper or aluminum which are coated with an insulating material.

Examples of usable insulating materials to insulate the vias 12 are organic insulating materials such as polyimide, epoxy, maleimide, cyanate ester, polyphenyl ether, polyolefine, silicon and aromatic resin. Insulating material to be used may be either of a thermosetting type or a thermoplastic type, however, it is preferable to use flexible material.

It is preferable that inorganic filler is mixed with insulating material because the coefficient of thermal expansion can be reduced, the radiating property can be enhanced and the mechanical strength can be enhanced. Examples of usable inorganic filler are inorganic powder or short fiber of alumina, silica glass, aluminum nitride and mullite.

The thickness of the insulating material, that is, the thickness of the sheath portion 16 is determined by a via pitch (distance between the centers of the adjacent vias) and the via diameter on one side 10a of the wiring board 10. For example, in the case where the vias 12, 12, • •, the diameter of which is 100 $\mu$m, are arranged at the via pitch of 250 $\mu$m on one side 10a of the wiring board 10 while the sheath portions 16 of the adjoining vias 12 are in contact with each other, it is possible to use a metallic wire, the diameter of which is 100 $\mu$m, coated with an insulator, the thickness of which is 75 $\mu$m.

In this connection, the vias 12 shown in FIGS. 1(a) to 2(c) are formed into straight lines, however, it is possible to use vias, a portion of which is formed into a curved line.

On the wiring boards shown in FIGS. 1(a) to 1(c) and FIGS. 2(a) to 2(c), the vias 12 have a two layer structure in which the core portion 14 made of a conductor is coated with the sheath portion 16 made of an insulator. However, as shown in FIGS. 4(a) to 4(c), the vias 12 may be composed of a three layer structure.

Figure 4A:
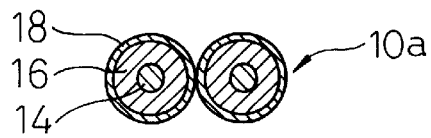
FIGS. 4(a) to 4(c) are schematic illustration for explaining another example of the wiring board of the present invention.
Figure 4B:
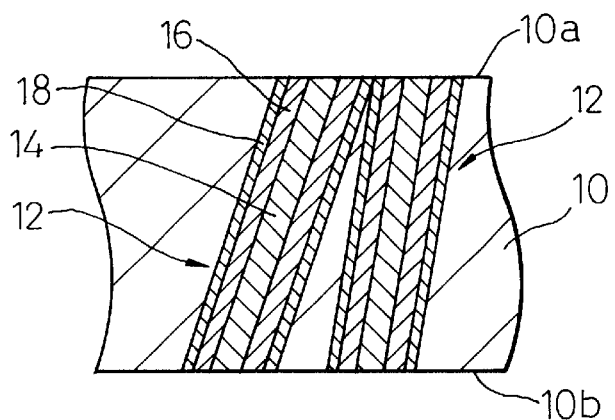
Figure 4C:
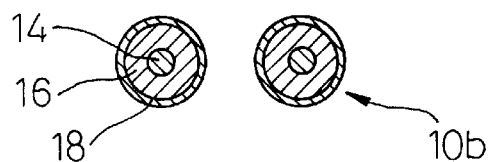

Concerning the wiring board of the second embodiment shown in FIGS. 4(a) to 4(c), the same reference characters are used to indicate similar or corresponding parts in the first and the second embodiment, and the detailed explanations are omitted here.

The vias 12 of the second embodiment are composed of a three layer structure, the detail of which is described as follows. The core portion 14 made of a conductor such as copper or aluminum is coated with the first sheath portion 16 made of an insulator. At the same time, the first sheath portion 16 is coated with the second sheath portion 18 made of a conductor layer.

Figure 5:
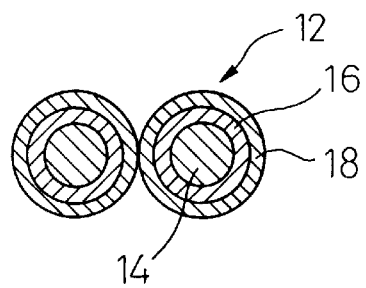
FIG. 5 is a schematic illustration for explaining a state in which vias come into contact with each other on one side of the wiring board shown in FIGS. 4(a) to 4(c).

Even when the second sheath portions 18 of the vias 12, 12 are in contact with each other as shown in FIG. 5, it is possible to prevent the core portions 14 made of a conductor from being electrically short-circuited with each other because the core portions 14 made of a conductor are insulated by the first sheath portions 16. Due to the foregoing, it is possible to form the vias 12, 12, • • at high density on one side 10a of the wiring board 10, and highly accumulated flip chip type semiconductor elements, on the bottom surface of which a large number of bumps are formed so as to be used as electrode terminals, can be mounted on one side 10a of the wiring board 10.

On the other side 10b of the wiring board 10, it is possible to extend the intervals Wc between the vias 12, 12, • • so that external connecting terminals such as solder balls can be attached onto the other side 10b. Therefore, the external connecting terminals can easily be attached onto the other side 10b.

When the sheath portion 18 of the via 12 in the second embodiment is connected to a ground line arranged on the wiring board 10, it is possible to form a coaxial-cable-like via 12 in which the conductor of the core portion 14 is surrounded and shielded by the sheath portion 18. Therefore, it is possible to provide a wiring board 10 to be used for signals of high frequency.

When the second sheath portion 18 of the via 12 is connected with the ground line arranged on one side 10a of the wiring board 10, it is possible to accomplish the connection between the second sheath portion 18 of the via 12 and the ground line by connecting the second sheath portions 18 with each other as shown in FIG. 5.

The conductor to form the above second sheath portion 18 can be provided when a conductor layer made of metal such as copper is formed on the circumferential surface of the first sheath portion 16 by means of electroless plating.

Figure 6:
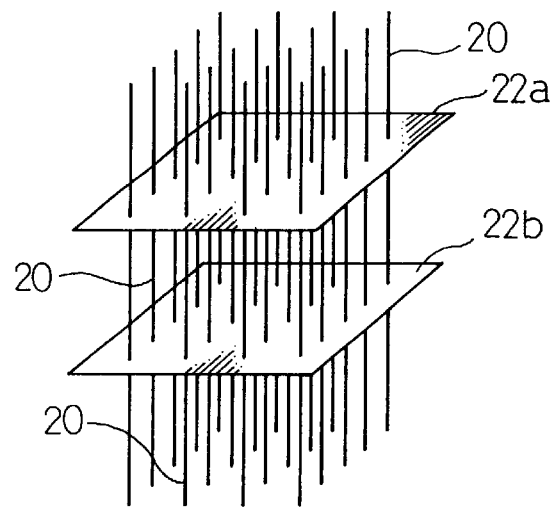
FIGS. 6 to 8 are schematic illustrations for explaining a process of manufacturing the wiring board of the present invention.

When the wiring board 10 of the first embodiment is manufactured, first, a plurality of wires 20, 20, • •, in which metallic wires made of metal such as copper or aluminum are coated with the sheath portions made of insulating material, are arranged in parallel to each other while predetermined intervals are left as shown in FIG. 6. Also, when the wiring board 10 of the second embodiment is manufactured, first, a plurality of wires 20, 20, • •, in which metallic wires made of metal such as copper or aluminum are coated with the first sheath portions made of insulating material and the first sheath portion is coated with the second sheath portion made of a conductor, are arranged in parallel to each other while the predetermined intervals are left as shown in FIG. 6.

When the plurality of wires 20, 20, • • are arranged in parallel to each other in the manner described above, it is preferable to use two guide plates 22a, 22b, which are arranged in parallel to each other, having guide holes into which the wires 20 are inserted at predetermined intervals. When each wire 20, 20, • • is inserted into each guide hole formed on each guide plate 22a, 22b, it is possible to arrange the wires 20, 20, • • in parallel to each other at predetermined intervals.

Figure 7:
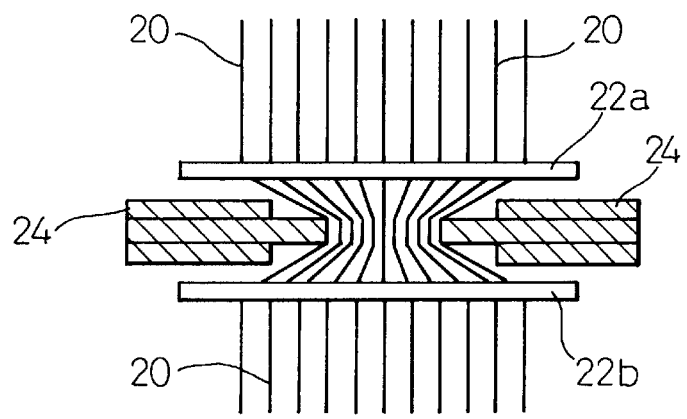

Next, the wires 20, 20, • • arranged in parallel to each other at predetermined intervals as shown in FIG. 6 are made up into a bundle as shown in FIG. 7. The wires 20, 20, • • can be easily bundled by inserting a bundling tool 24, 24 between the guide plates 22a, 22b in parallel.

When the wires are made up into a bundle in this way, the lengths of some wires, which are pushed by the bundling tool 24, 24, are increased so that they longer than the distance between the guide plates 22a, 22b shown in FIG. 6. Therefore, it is preferable that diameters of the guide holes formed on the guide plates 22a, 22b are sufficiently large so that the wires 20 can be freely moved in the guide holes.

Figure 8:
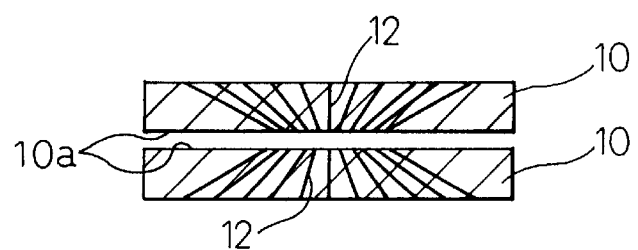
Figure 9A:
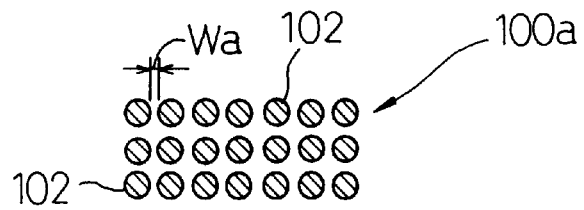
FIGS. 9(a) to 9(c) are schematic illustrations for explaining an example of the conventional wiring board.
Figure 9B:
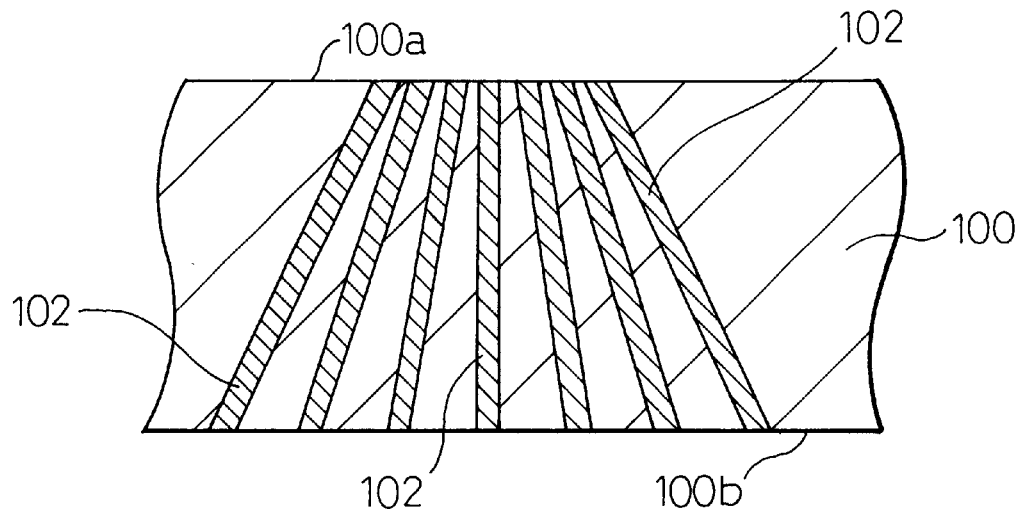
Figure 9C:
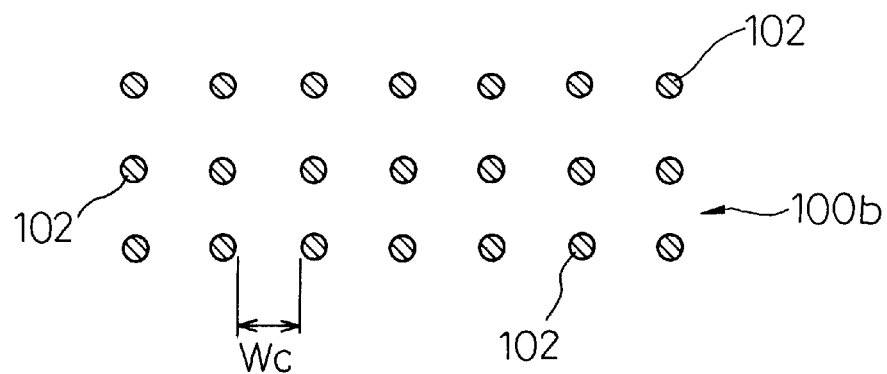

After that, while the bundling condition of the wires 20, 20, • • is kept, fluid resin is poured and solidified between the guide plates 22a, 22b. Then, the wires 20, 20, • • and the bundling section are cut off. After the completion of cutting, the surface 10a (shown in FIG. 8) of the wiring board, on which the wires 20 are made into a bundle, is polished so that the sheath portions (shown in FIGS. 1(a) to 1(c)) cannot be in contact with each other. Due to the foregoing, it is possible to obtain two wiring boards 10, 10 as shown in FIG. 8.

In this connection, instead of the fluid resin to be poured between the guide plates 22a, 22b, a fluid precursor may be poured and solidified.

As shown in the first and second embodiments, the intervals of the vias 12 arranged on one side of the wiring board 10 can be extremely reduced, and it is possible to mount highly accumulated flip chip type semiconductor elements, on the bottom surfaces of which a large number of bumps to be used as electrode terminals are provided, on one side of the wiring boards 10.

On the other side of the wiring board 10, it is possible to extend the intervals of the vias 12 as much as required. Therefore, external connecting elements such as solder balls can easily be attached onto the other side of the wiring board 10.

INDUSTRIAL APPLICABILITY

According to the wiring board of the present invention, on one side of the wiring board, it is possible to further reduce the intervals of the vias. On the other side of the wiring board, it is possible to extend the intervals of the vias as much as required. Therefore, external connecting terminals can be easily attached onto the other side of the wiring board. Accordingly, the density of the wiring board of the present invention is sufficiently high so that highly accumulated semiconductor elements can be mounted on the wiring board.

What is claimed is:

1. A wiring board comprising:
   vias, penetrating the wiring board from one side to an opposite side, composed of an electrical conductor forming a core portion and an insulator having sheath portions coating said electrical conductor, said vias being radially formed with a first interval between said vias on the one side smaller than a second interval between said vias on the opposite side and the sheath portions of at least some of said vias on the one side contacting said sheath portions of adjacent vias.

2. The wiring board according to claim 1, wherein the via is composed of a metallic wire located at the center of the via, and an organic insulator coating the outer circumferential surface of the metallic wire.

3. A wiring board comprising:
   vias penetrating the wiring board from one side to an opposite side and radially formed with a first interval between said vias on the one side smaller than a second interval between said vias on the opposite side, said vias composed of
   an electrical conductor forming a core portion,
   a first sheath portion made of an insulator coating said electrical conductor, and
   a second sheath portion made of a conductive layer coating said first sheath portion, said second sheath portion of at least some of said vias on the one side contacting said second sheath portion of adjacent vias.

4. The wiring board according to claim 3, wherein the second sheath portion, which is a conductive layer, is electrically connected to a ground line formed on the wiring board.

5. The wiring board according to claim 3, wherein the via is composed of a wire-shaped body including an insulator coating an outer circumferential surface of the metallic wire located at the center of the wire-shaped body and also including a conductor layer coating an outer circumferential surface of the insulator.

* * * * *